(12) United States Patent
Cho et al.

(10) Patent No.: US 7,759,737 B2
(45) Date of Patent: Jul. 20, 2010

(54) DUAL STRUCTURE FINFET AND METHOD OF MANUFACTURING THE SAME

(75) Inventors: Young Kyun Cho, Daejeon (KR); Tae Moon Roh, Daejeon (KR); Jong Dae Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 453 days.

(21) Appl. No.: 11/924,903

(22) Filed: Oct. 26, 2007

(65) Prior Publication Data

US 2008/0135935 A1 Jun. 12, 2008

(30) Foreign Application Priority Data

Dec. 7, 2006 (KR) .................. 10-2006-0123983

(51) Int. Cl.
*H01L 27/12* (2006.01)
(52) U.S. Cl. .................. 257/347; 257/401; 257/E21.7; 257/E21.112
(58) Field of Classification Search .............. 257/347, 257/401, E21.7, E21.703, E27.112
See application file for complete search history.

(56) References Cited

U.S. PATENT DOCUMENTS

| | | | |
|---|---|---|---|
| 6,197,641 B1 | 3/2001 | Hergenrother et al. | |
| 6,329,273 B1 * | 12/2001 | Thurgate et al. | 438/558 |
| 6,451,656 B1 | 9/2002 | Yu et al. | |
| 6,773,994 B2 | 8/2004 | Chittipeddi et al. | |

(Continued)

FOREIGN PATENT DOCUMENTS

KR 19940001344 1/1994

(Continued)

OTHER PUBLICATIONS

Xusheng Wu, et al; "A Three-Dimensional Stacked Fin-CMOS Technology for High-Density ULSI Circuits;" IEEE Transactions on Electron Devices, vol. 52, No. 9, Sep. 2005.

(Continued)

*Primary Examiner*—Thomas L Dickey
*Assistant Examiner*—Fazli Erdem
(74) *Attorney, Agent, or Firm*—Ladas & Parry LLP

(57) ABSTRACT

Provided are a dual structure FinFET and a method of fabricating the same. The FinFET includes: a lower device including a lower silicon layer formed on a substrate and a gate electrode vertically formed on the substrate; an upper device including an upper silicon layer formed on the lower device and the vertically formed gate electrode; and a first solid source material layer, a solid source material interlayer insulating layer, and a second solid source material layer sequentially formed between the lower silicon layer and the upper silicon layer. Therefore, the FinFET can be provided which enhances the density of integration of a circuit, suppresses thin film damages due to ion implantation using solid phase material layers, and has a stabilized characteristic by a simple and low-cost process. Also, mobility of an upper device can be improved to enhance current drivability of the upper device, isolation can be implemented through a buried oxide layer to reduce an effect due to a field oxide layer, and raised source and drain can be implemented to reduce serial resistance components of the source and drain to increase current drivability.

19 Claims, 9 Drawing Sheets

U.S. PATENT DOCUMENTS

| | | | | |
|---|---|---|---|---|
| 6,828,580 B2 * | 12/2004 | Zhang | | 257/24 |
| 6,914,277 B1 | 7/2005 | Hill et al. | | |
| 6,974,983 B1 | 12/2005 | Hill et al. | | |
| 7,064,022 B1 | 7/2006 | Hill et al. | | |
| 7,074,656 B2 * | 7/2006 | Yeo et al. | | 438/157 |

FOREIGN PATENT DOCUMENTS

| | | |
|---|---|---|
| KR | 1020050072233 | 7/2005 |
| KR | 1020050094576 | 9/2005 |
| KR | 1020050107090 | 11/2005 |
| KR | 1020050112471 | 11/2005 |
| KR | 1020060005041 | 1/2006 |
| KR | 1020060027440 | 3/2006 |
| KR | 1020060033232 | 4/2006 |
| KR | 1020060100993 | 9/2006 |
| KR | 1020070000681 | 1/2007 |
| KR | 1020070008024 | 1/2007 |

OTHER PUBLICATIONS

J.M. Hergenrother, et al.; "The Vertical Replacement-Gate (VRG) MOSFET: A 50-nm Vertical MOSFET with Lithography-Independent Gate Length;" Electron Devices Meeting, 1999. IEDM Technical Digest. International Volume, Issue, 1999 pp. 75-78.

Yang-Kyu Choi, et al.; "Sub-20nm CMOS FinFET Technologies;" International Electron Devices Meeting Technical Digest, pp. 421-424, 2001.

* cited by examiner

DUAL STRUCTURE FINFET AND METHOD OF MANUFACTURING THE SAME

CROSS-REFERENCE TO RELATED APPLICATION

This application claims priority to and the benefit of Korean Patent Application No. 2006-123983, filed Dec. 7, 2006, the disclosure of which is incorporated herein by reference in its entirety.

BACKGROUND

1. Field of the Invention

The present invention relates to a dual structure Fin Field Effect Transistor (FinFET) having a Fin channel and a method of manufacturing the same, and more particularly, to a FinFET having a dual structure where an N-type FinFET and a P-type FinFET which are formed of solid source material layers are stacked, and a method of manufacturing the same.

The present invention has been produced from the work supported by the IT R&D program of MIC (Ministry of Information and Communication)/IITA (Institute for Information Technology Advancement) [2006-S006-01, Components/Module technology for Ubiquitous Terminals] in Korea.

2. Discussion of Related Art

As techniques of manufacturing semiconductor devices are developed, attempts are made to decrease the size of the device and increase the operating speed or the like for enhancing performance. Accordingly, Metal Oxide Semiconductor FETs (MOSFETs) as the mainstream of the devices used in electronics today have been also continuously scaled down, and a double gate FinFET and a multi-gate structure are proposed to solve a short channel effect.

FIG. 1 is a perspective view of a conventional FET using a MOSFET. Referring to FIG. 1, a conventional transistor 800 using a MOSFET includes an N-type well 801 and a P-type well 802 formed in a silicon substrate, and a gate insulating layer 810 and gate electrodes 807 and 809 formed on the N-type well 801 and the P-type well 802. A P-type source 803 and a P-type drain 804 are formed in the N-type well 801, and an N-type source 805 and an N-type drain 806 are formed in the P-type well 802. Accordingly, a P-type MOSFET (PMOS) and an N-type MOSFET (NMOS) are formed. When the gate electrodes 807 and 809 are connected in common in the above-described structure, a horizontal type FinFET can be obtained. The NMOS and PMOS of the transistor 800 are insulated by a field oxide layer 808.

However, in the horizontal type transistor 800 having the above-described configuration, the NMOS and PMOS are formed on the same plane, so that the integration density of a circuit is not significantly enhanced when the FinFET is configured even when actual sizes of devices are decreased. Further, in the case of the PMOS, hole mobility is lower than electron mobility so that the width of the PMOS should be formed two to three times larger than the width of the NMOS in order to have the same level of current drivability as the NMOS, and the area of the FinFET actually becomes three to four times larger than the area of the NMOS layout, which thus causes a limit on enhancement of the density of integration.

To solve such a problem, a FinFET having a dual structure is disclosed in Korean Patent Registration No. 10-0583391 entitled "Stack Structured FinFET Transistor and CMOS Inverter Structures and Method for Manufacturing The Same." However, according to the disclosed invention, ions are required to be selectively implanted into source and drain of each of upper and lower transistors, which cannot be easily accomplished by the current process technology, and the lower device should not be affected by ions to be implanted for forming the source and drain of the upper device. Also, when a contact hole of the lower device is formed, an upper surface should be exposed and a portion of an interlayer dielectric layer should be left on a side surface of the contact hole, which requires a complicated process that cannot be easily implemented.

SUMMARY OF THE INVENTION

The present invention is directed to a dual structure FinFET and a method of manufacturing the same, which forms a solid source material layer between an N-type FinFET and a P-type FinFET formed in a dual structure and defines source and drain regions through diffusion of the solid source material to enhance the density of integration of a circuit.

The present invention is also directed to a dual structure FinFET and a method of manufacturing the same, which forms an upper device of an epitaxial layer of silicon or silicon germanium to increase carrier mobility.

The present invention is also directed to a dual structure FinFET and a method of manufacturing the same, which enables an NMOS and a PMOS vertically insulated from each other to include raised source and drain by adjusting the thickness of a buried oxide layer formed by Separation by IMplantation of OXygen (SIMOX).

The present invention is also directed to a dual structure FinFET and a method of manufacturing the same, which forms only a portion of an upper device of an oxide layer to be electrically insulated from a side of a source of the upper device when a source contact of a lower device is formed.

One aspect of the present invention provides a FinFET, which comprises: a lower device including a lower silicon layer formed on a substrate and a gate electrode vertically formed on the substrate; an upper device including an upper silicon layer formed on the lower device and the vertically formed gate electrode; and a first solid source material layer, a solid source material interlayer insulating layer, and a second solid source material layer sequentially formed between the lower silicon layer and the upper silicon layer.

The first solid source material layer and the second solid source material layer may be made of boronsilicate glass (BSG), phosphosilicate (PSG), p-doped tetraethylene-ortho-silicate (B-TEOS), or n-doped tetraethylene-ortho-silicate (P-TEOS). The first solid source material layer and the second solid source material layer may be made of impurities of different types from each other. The solid source material interlayer insulating layer may be made of at least one layer of a nitride layer and an oxide layer.

The upper silicon layer may be made of an epitaxially grown epitaxial layer, amorphous silicon, or polycrystalline silicon. The FinFET may further comprise: a buried oxide layer formed in central regions of the first solid source material layer, the solid source material interlayer insulating layer and the second solid source material layer; a gate insulating layer surrounding the gate electrode; a common drain contact electrically connected to the lower silicon layer and the upper silicon layer; a lower source contact electrically insulated from the upper silicon layer and electrically connected to the lower silicon layer; and an upper source contact electrically connected to the upper silicon layer.

The buried oxide layer may be formed from the first solid source material layer to the second solid source material layer. The buried oxide layer may comprise a first extension extending into the lower silicon layer and a second extension extending into the upper silicon layer.

The first and second extensions may be formed by diffusing oxygen ions into the upper and lower silicon layers by annealing performed after the oxygen ions are implanted, and each of the first and second extensions may have a thickness of 10 nm to 100 nm.

The FinFET may further comprise: a lower solid source material layer formed below the lower silicon layer; and an upper solid source material layer formed above the upper silicon layer. The substrate may be one of a silicon on insulator (SOI) substrate, a silicon substrate, a silicon germanium on insulator (SGOI) substrate and a silicon germanium (SiGe) substrate.

Another aspect of the present invention provides a method of manufacturing a Fin Field Effect Transistor (FinFET), which comprises: preparing a substrate where a lower silicon layer is formed; sequentially forming a first solid source material layer, a solid source material interlayer insulating layer, and a second solid source material layer, on the lower silicon layer; etching the first solid source material layer, the solid source material interlayer insulating layer and the second solid source material layer, and forming an upper silicon layer on an etched region and the second solid source material layer; forming an buried oxide layer by annealing after the upper silicon layer is formed; blanket plasma-etching the upper silicon layer, the second solid source material layer, the solid source material interlayer insulating layer, and the first solid source material layer to form an active region of a Fin structure channel; depositing and etching a gate material on the substrate to form a gate electrode; and forming a gate insulating layer above the gate electrode, forming a drain contact and a first source contact to be electrically connected to the lower silicon layer on the gate insulating layer, and forming a second source contact to be electrically connected to the upper silicon layer on the gate insulating layer.

The upper silicon layer may be formed of one of an epitaxially grown epitaxial layer, amorphous silicon and polycrystalline silicon. The method may further comprise forming a chemical mechanical polishing stopper for controlling the growth height of the epitaxial layer when the upper silicon layer is the epitaxial layer. The method may further comprise: forming a lower solid source material layer below the lower silicon layer; and forming an upper solid source material layer on the upper silicon layer.

The first and second solid source material layers, and the lower and upper solid source material layers may be formed of one of doped boronsilicate glass (BSG), doped phosphosilicate (PSG), p-doped tetraethylene-ortho-silicate (B-TEOS) and n-doped tetraethylene-ortho-silicate (P-TEOS). The first solid source material layer and the second solid source material layer may be made of impurities of different types from each other.

The method may further comprise forming an oxide layer in the first source contact region in contact with the upper silicon layer to electrically insulate the upper silicon layer from the first source contact at the time of forming the first source contact.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure is thorough and complete and fully conveys the scope of the invention to those skilled in the art.

Figure 1:
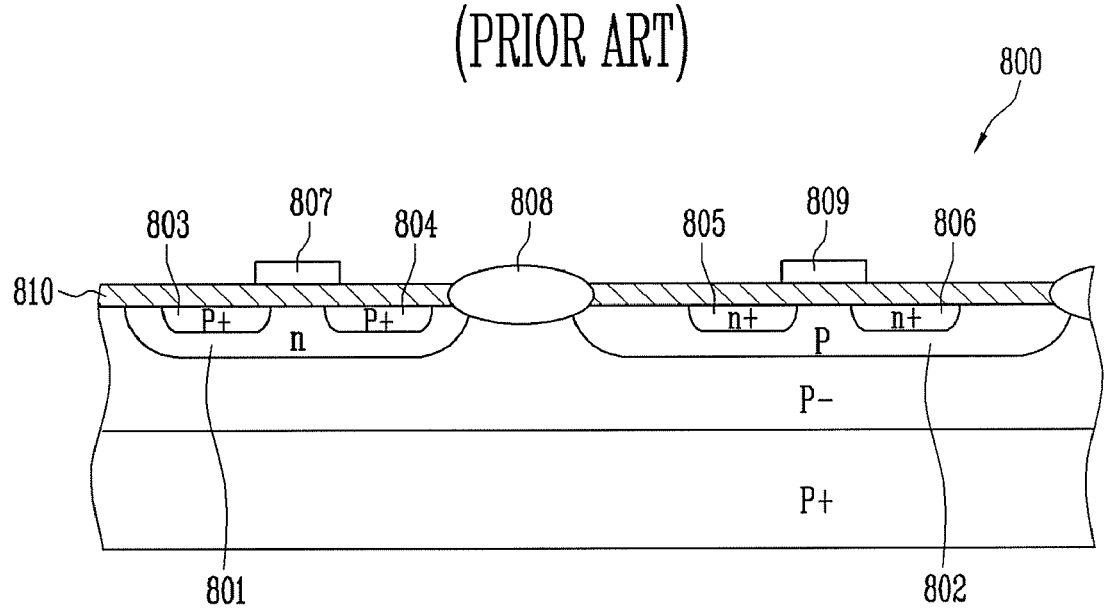
FIG. 1 is a perspective view of a conventional FET using a MOSFET.
Figure 2:
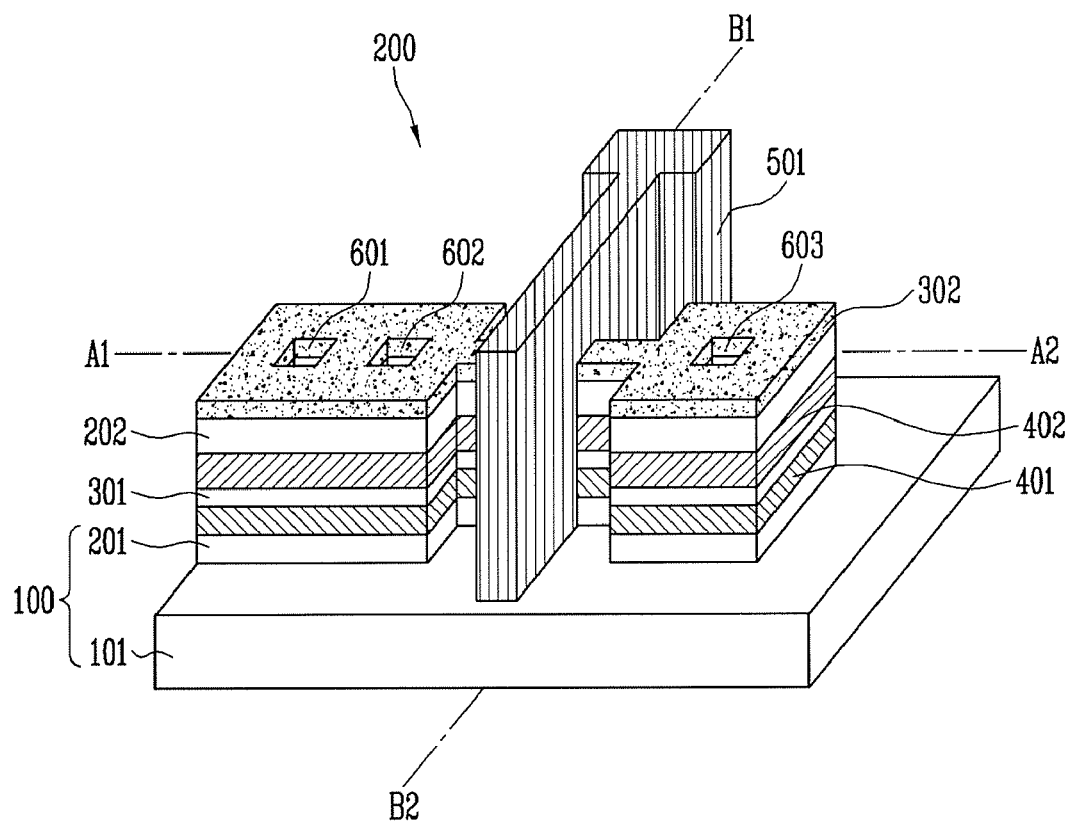
FIG. 2 is a partially enlarged perspective view of a dual structure FinFET according to a first embodiment of the present invention.

FIG. 2 is a partially enlarged perspective view of a dual structure FinFET according to a first embodiment of the present invention.

Referring to FIG. 2, a FinFET 200 according to the present invention includes a substrate 100 composed of an oxide layer 101 and a lower silicon layer 201 as a single crystalline silicon layer, a lower device having a gate electrode 501, an upper device formed above the lower device and having the gate electrode 501, first and second solid source material layers 401 and 402 formed between the lower and upper devices, and a solid source material interlayer insulating layer formed between the first solid source material layer 401 and the second solid source material layer 402.

The upper device and the lower device may have an N-type FinFET and a P-type FinFET, or may have a P-type FinFET and an N-type FinFET, respectively. In the present embodiment, the upper and lower devices include the gate electrode 501 and a drain contact 603 in common, and individually include source contacts 601 and 602. The N-type FinFET and the P-type FinFET as the lower and upper devices are separated by the first solid source material layer 401, the solid source material interlayer insulating layer 301, the second solid source material layer 402, and a buried oxide layer (not shown).

FIGS. 3A, 4A, 5A, 6A, 7A, and 8A are side cross-sectional views illustrating formation steps of a dual structure FinFET taken along line A1-A2 of FIG. 2, and FIGS. 3B, 4B, 5B, 6B, 7B, and 8B are side cross-sectional views illustrating formation steps of a dual structure FinFET taken along line B1-B2 of FIG. 2. Hereinafter, a configuration of the FinFET and a process of manufacturing the same according to the present invention will be described in detail with reference to FIGS. 3 to 8.

Figure 3A:
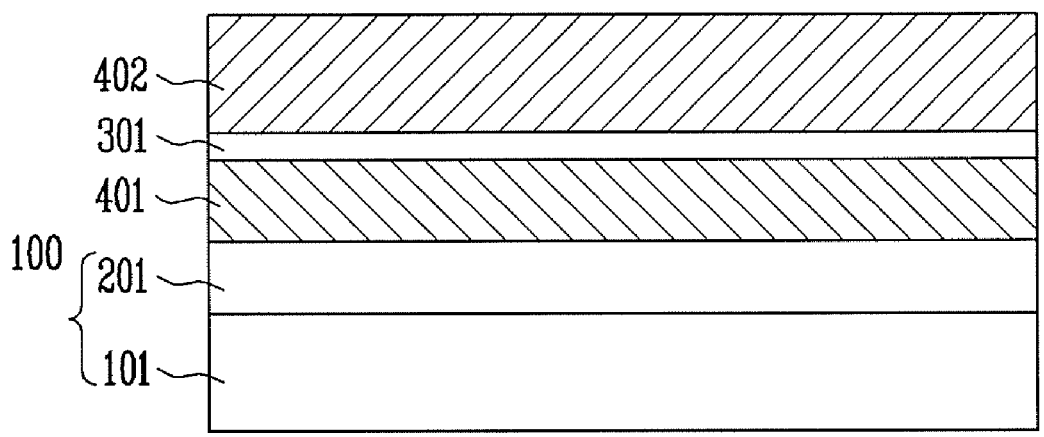
FIGS. 3A, 4A, 5A, 6A, 7A, and 8A are side cross-sectional views illustrating formation steps of a dual structure FinFET taken along line A1-A2 of FIG. 2, and FIGS. 3B, 4B, 5B, 6B, 7B, and 8B are side cross-sectional views illustrating formation steps of a dual structure FinFET taken along line B1-B2 of FIG. 2.
Figure 3B:
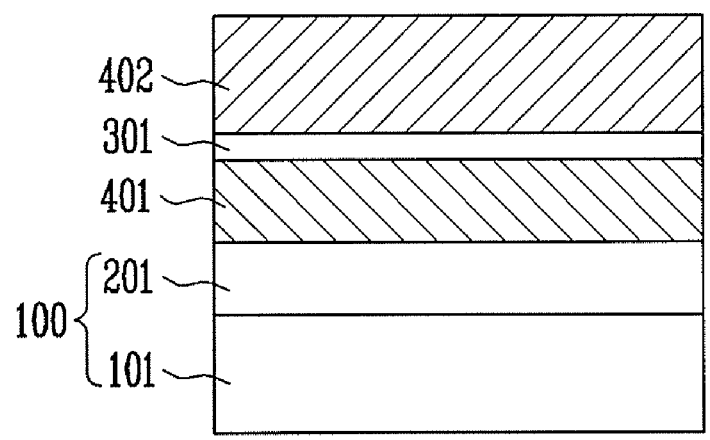

Referring to FIGS. 3A and 3B, in order to manufacture the FinFET 200 according to the present invention, a substrate 100 where devices are to be formed is first prepared. A silicon on insulator substrate, a silicon substrate, a silicon germanium on insulator (SGOI) substrate, or a silicon germanium (SiGe) substrate may be employed as the substrate 100. When the silicon substrate is employed, counter doping may be performed to decrease a leakage current of the lower device and lower a threshold voltage. In the present embodiment, the SOI substrate 100 composed of the oxide layer 101 and the lower silicon layer 201 as a single crystalline silicon layer is employed.

For doping of source and drain regions, the first solid source material layer 401, the solid source material interlayer insulating layer 301, and the second solid source material layer 402 are sequentially formed on the lower silicon layer 201. Boronsilicate glass (BSG), phosphosilicate glass (PSG), p-doped tetraethylene-ortho-silicate (B-TEOS), or n-doped tetraethylene-ortho-silicate (P-TEOS), which is sufficiently doped to act as a source and a drain, is used for forming the first and second solid source material layers 401 and 402. The stacked first and second solid source material layers 401 and 402 must be formed of impurities of different types from each other.

For example, when the first solid source material layer 401 is formed of a material doped with a group V element including phosphor, the second solid source material layer 402 must be formed of a material doped with a group III element including boron. That is, when the first solid source material layer 401 is formed of PSG, the second solid source material layer 402 is formed of BSG. When the first and second solid source material layers 401 and 402 are formed of the respective solid source materials (phosphor, boron or the like), the lower device may be a device having an N-type channel and the upper device may be a device having a P-type channel. It is also possible to change the conductivities of the upper and lower devices based on the use of an inverter circuit.

Meanwhile, the solid source material interlayer insulating layer 301 formed on the first solid source material layer 401 may be an insulating layer such as an nitride layer or an oxide layer for preventing the first and second solid source material layers 401 and 402 from being mutually diffused and contaminated.

Figure 4A:
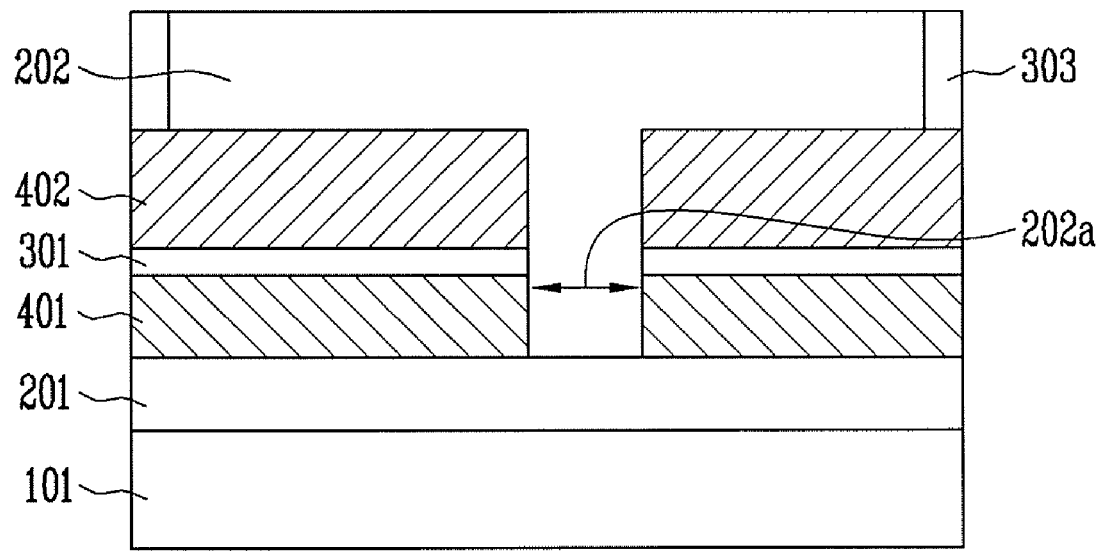
Figure 4B:
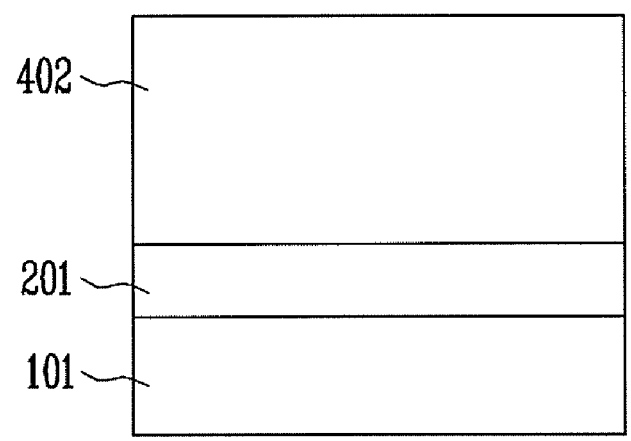

In the next step, referring to FIGS. 4A and 4B, the first solid source material layer 401, the solid source material interlayer insulating layer 301, and the second solid source material layer 402 are etched to form an upper silicon layer 202. In the present embodiment, the upper silicon layer 202 is an epitaxial layer grown with an epitaxial material, which is used to form an upper device. At this time, an etched width 202a is appropriately determined in consideration of overlapping with the gate. Preferably, the etched width 202a has a magnitude smaller than the gate length by 5 nm to 100 nm. The epitaxial layer as the upper silicon layer 202 may be formed of a material such as silicon, silicon germanium or the like which can be epitaxially grown, and may be formed in an in-situ doping manner for doping the substrate.

When the epitaxial layer as the upper silicon layer 202 is formed of silicon germanium, mobility of channel ions is increased than the epitaxial layer formed of silicon to obtain high current drivability and decrease the height of the upper silicon layer 202, however, when the epitaxial layer is formed of silicon, the height of the upper silicon layer can be determined in consideration of a conductivity of the lower device. For example, when the lower device is determined to be an N-type FinFET, the upper silicon layer 202 may have a height two to five times higher than the height of the lower silicon layer 201 so that the current drivability of the upper P-type FinFET can be enhanced. The layout area is increased by two to five times by the P-type device to increase the area of the circuit in accordance with the conventional plane type transistor circuit whereas the P-type device is formed in the area of forming the N-type device to simply increase the height only so that the density of integration of the circuit can be rapidly increased in accordance with the embodiment of the present invention.

Also, it is preferable to use a chemical mechanical polishing (CMP) method for exactly controlling the height of the upper silicon layer 202 as the epitaxial layer, and to this end, a CMP stopper 303 is formed on a side surface of the upper silicon layer 202 formed above the second solid source material layer 402.

Figure 5A:
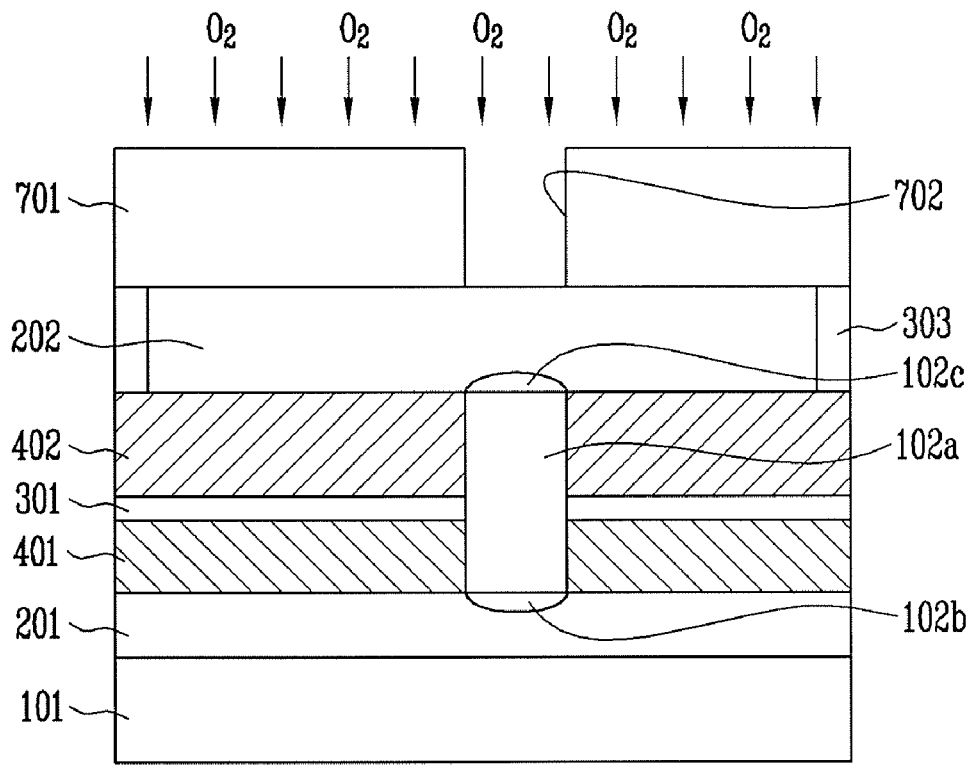
Figure 5B:
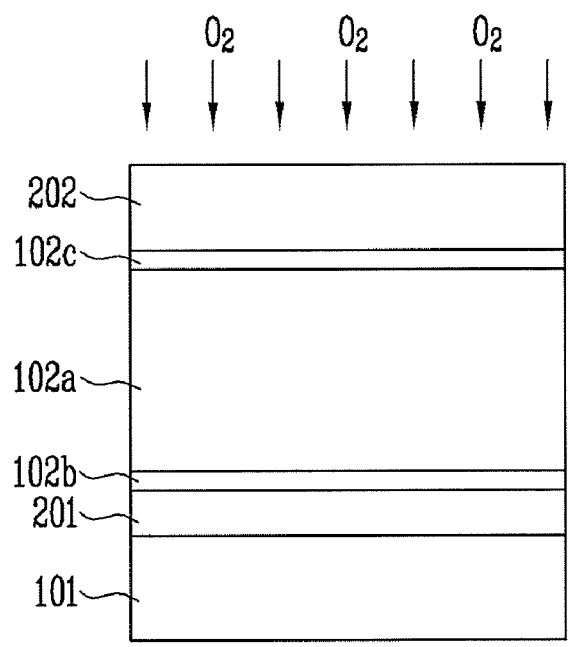

In the next step, referring to FIGS. 5A and 5B, a mask 701 is formed on the upper silicon layer 202 to insulate the upper and lower devices from each other. A window size 702 formed in the mask 701 can be determined in consideration of the overlapped length between a gate (not shown) and source and drain (not shown). Preferably, the window size has a magnitude smaller than the gate length by 5 nm to 100 nm. After the mask 701 is formed, a SIMOX method is used to form an oxygen ion implantation layer. When the oxygen ion implantation layer is transformed to a buried oxide layer 102a by an annealing process after the oxygen ion implantation layer is formed, the upper device and the lower device can be electrically separated from each other.

The buried oxide layer 102a has a thickness ranging from the lower portion of the first solid source material layer 401 to the upper portion of the second solid source material layer 402. First and second extensions 102b and 102c are formed in the buried oxide layer 102a which extend into the lower and upper device regions by predetermined thicknesses, respectively. Since the first and second extensions 102b and 102c are extended, series parasitic resistances of source and drain can be decreased, and heights of the source and drain can be higher than the height of a channel region to obtain a raised source and drain effect.

The annealing performed to form the buried oxide layer 102a causes the first and second solid source material layers 401 and 402 to be diffused into the lower and upper silicon layers 201 and 202 so that the source and drain of the upper and lower devices are formed. The source and drain formed by extensions of the first and second solid source material layers 401 and 402 do not requires additional ion implantation or annealing for the source and drain, which are thus suitable for a low temperature-subsequent process and are specifically advantageous for forming a high-k gate insulating layer and a metal gate having a midgap work function.

Figure 6A:
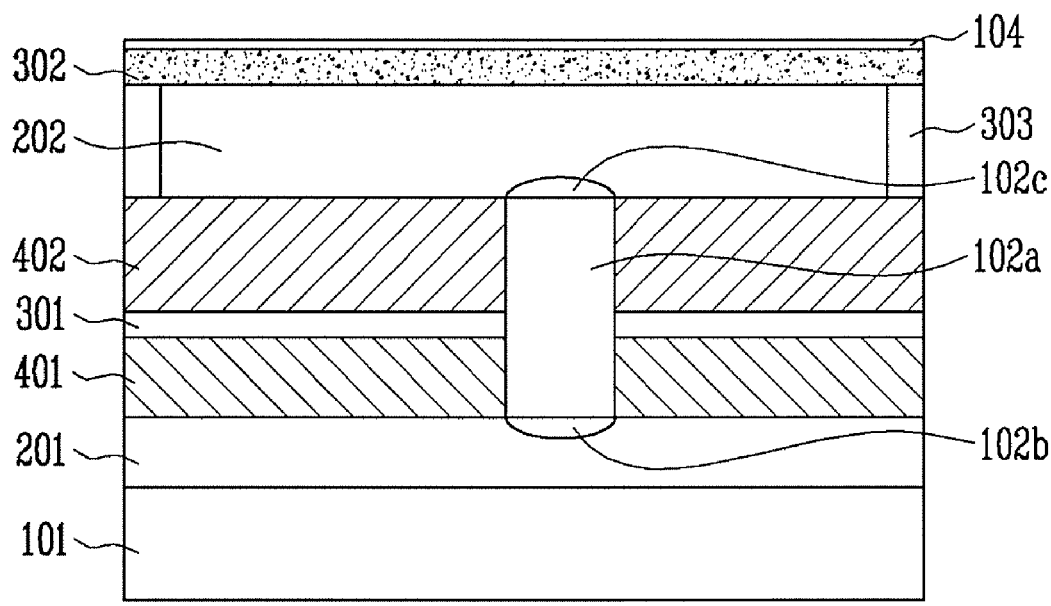
Figure 6B:
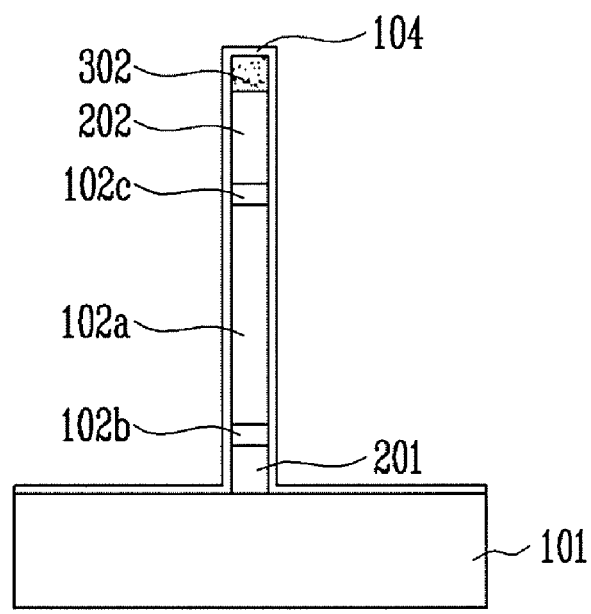

Referring to FIGS. 6A and 6B, a first upper insulating layer 302 is stacked on the upper silicon layer 202 formed of an epitaxial layer to suppress formation of an upper channel of the upper device. In the next step for forming a Fin channel device, the first upper insulating layer 302, the upper silicon layer 202, the second solid source material layer 402, the solid source material interlayer insulating layer 301, the first solid source material layer 401, the buried oxide layer 102a, and the lower silicon layer 201 are blanket and anisotropically plasma-etched to form an active region of a Fin channel. In the present embodiment, the upper device and the lower device have the same Fin width when the Fin structure is formed, however, the upper and lower devices may have different Fin widths from each other in accordance with the use of the circuit when the Fin structure is formed. Also, a method of forming a Fin structure using techniques (i.e., techniques excluding exposure and development) other than the above-described Fin structure technique is disclosed in Korean Patent Registration No. 10-0532564 entitled "Multiple-gate MOS Transistor and a Method for Manufacturing The Same."

Meanwhile, the first upper insulating layer 302 is stacked for suppressing the channel formation in the above-described embodiment, however, the first upper insulating layer 302 may not be formed and a thermal oxidation process may be used to form a corner of the upper device in a ∩-shape for relieving a corner effect of the upper device. In this case, the channel of the upper device along with both sidewalls of the upper device forms an upper portion.

The width of the patterned Fin is preferably not greater than one half to one third of the gate length for suppressing the short channel effect and obtaining a completely depleted channel. The channel is formed through an inside or sidewalls of the lower and upper silicon layers 201 and 202 of the structure formed by the patterning (see FIG. 6B). To relieve the damages of the sidewalls of the Fin structure due to the etching process, it is preferable to perform annealing in a nitrogen or argon atmosphere after forming and removing a sacrificial oxide layer. In the next step, a gate insulating layer 104 is formed to surround the patterned Fin. A silicon oxide layer, a nitride layer, a high-k insulating layer, or the like may be used as the gate insulating layer 104.

Figure 7A:
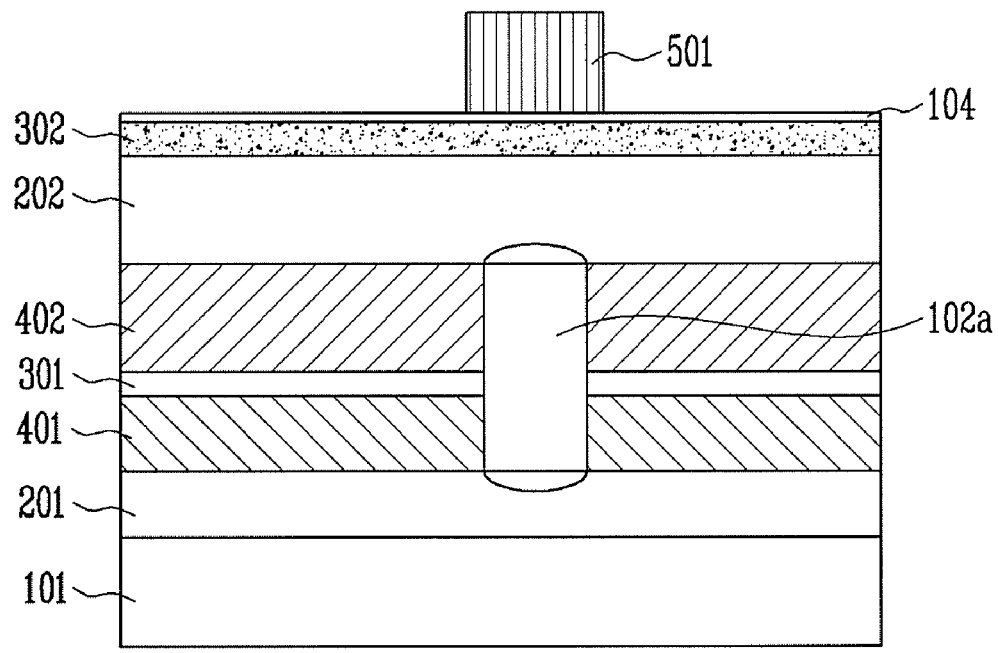
Figure 7B:
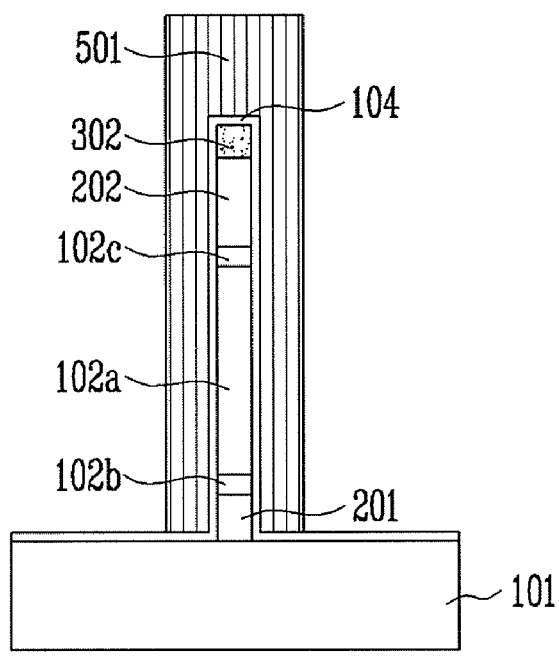

Referring to FIGS. 7A and 7B, a conductive layer such as a P or N-type polysilicon or silicon germanium layer is stacked on the entire surface of the Fin where the gate insulating layer 104 is formed, and a gate electrode 501 is formed using the stacked conductive layer. Preferably, the gate electrode 501 is formed of a metal material having a midgap work function such as TiN, TaN, Mo, W, Ru, NiSi, or $CoSi_2$. When the gate is formed of a metal material having a midgap work function, threshold voltages of the N-type device and the P-type device can be appropriately adjusted.

To detail this, the conductive layer disposed on the entire surface of the Fin is patterned by a nano patterning process using photo lithography to form the gate electrode 501. In the patterning process, the gate electrode 501 surrounds the buried oxide layer 102a and preferably has a length greater than the width of the buried oxide layer 102a (see FIG. 7B). Since the gate electrode 501 is formed by the above-described method, the N-type FinFET and the P-type FinFET have the gate electrode 501 in common.

Figure 8A:
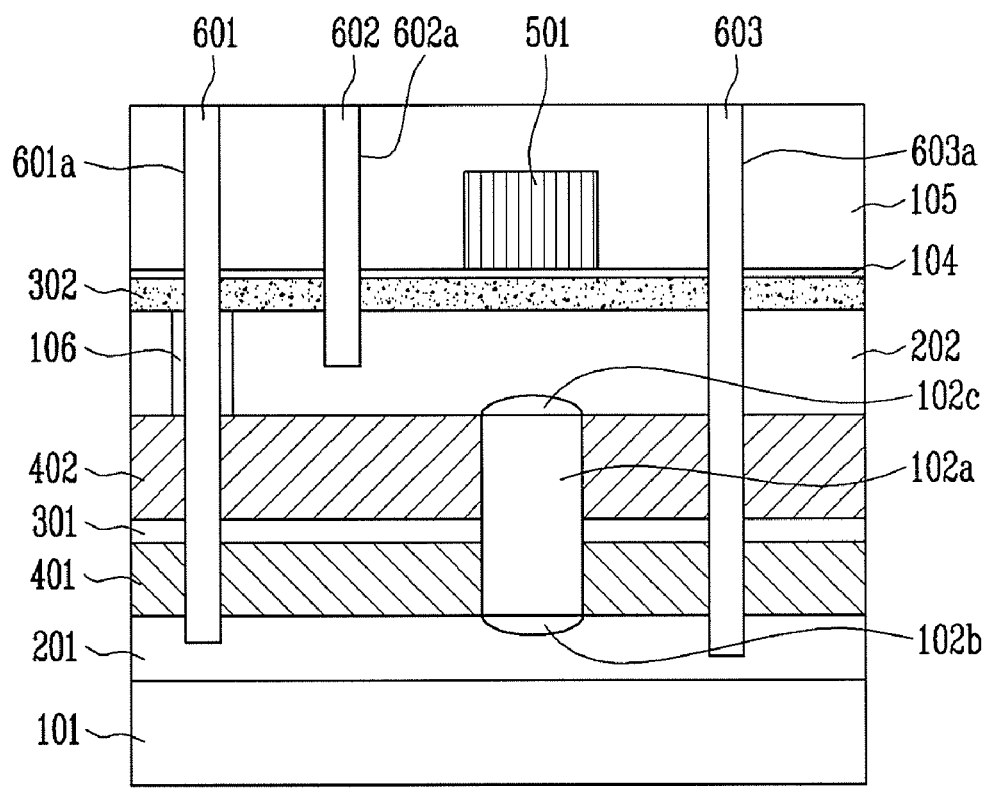
Figure 8B:
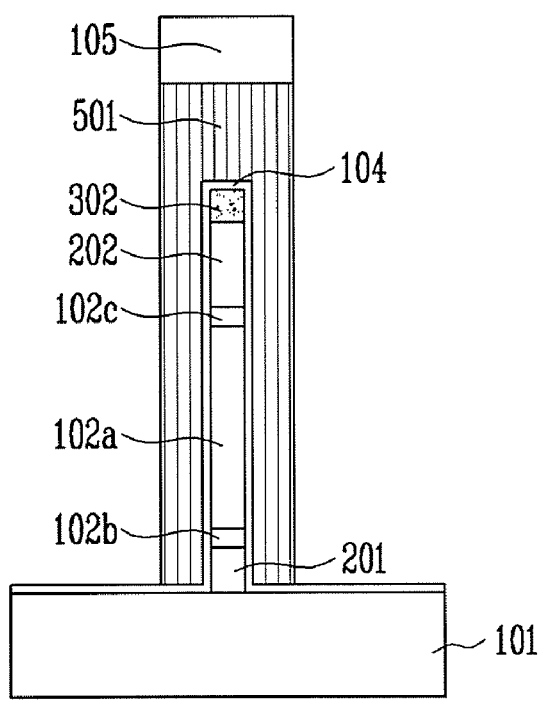

A process of forming source and drain contacts of the FinFET is illustrated in FIG. 8A. A second upper insulating layer 105 is formed above the gate insulating layer 104 and the gate electrode 501. A lower device source contact hole 601a is formed by trench etching to have a depth of the etched hole ranging from the second solid source material layer 402 to the lower silicon layer 201 through the first solid source material layer 401. A thermal oxide layer 106 is then formed in the upper silicon layer 202 constituting the upper device where the lower device source contact hole 601a is formed by the thermal oxidation process. A metal interconnection is then used to form the lower device source contact 601 in the lower source contact hole 601a. By means of the thermal oxide layer 106 formed in the upper silicon layer 202 by the thermal oxidation process, the upper silicon layer 202 is insulated from the lower device without affecting a source metal interconnection formed for the lower device source contact 601. There are many insulating methods of preventing the upper device from being affected due to the metal interconnection formed in the lower device source contact hole 601a. For example, after a first trench etching process is performed, the upper silicon layer 202 may be wet-etched, an insulating layer may be formed using an Atomic Layer deposition (ALD) of thin film, and a source contact of the lower device may be formed by an additional trench etching.

The trench is then etched down to the upper silicon layer 202 to form a source interconnection of the upper device. The upper device source contact 602 is formed in the upper device source contact hole 602a which is trench-etched using the metal interconnection. The structure can be easily formed by a general metal interconnection process. The FinFET circuit must have the drain contact 603 of the N-type device and the P-type device in common. To this end, trench etching is performed to make the depth of the drain contact hole 603a positioned in the middle of the lower silicon layer 201 or in the oxide layer 101, and the contact is formed through sidewalls of the upper and lower devices. According to the embodiment described with reference to FIGS. 3 to 8, the FinFET having upper and lower devices, i.e., a stacked inverter, can be implemented.

Figure 9A:
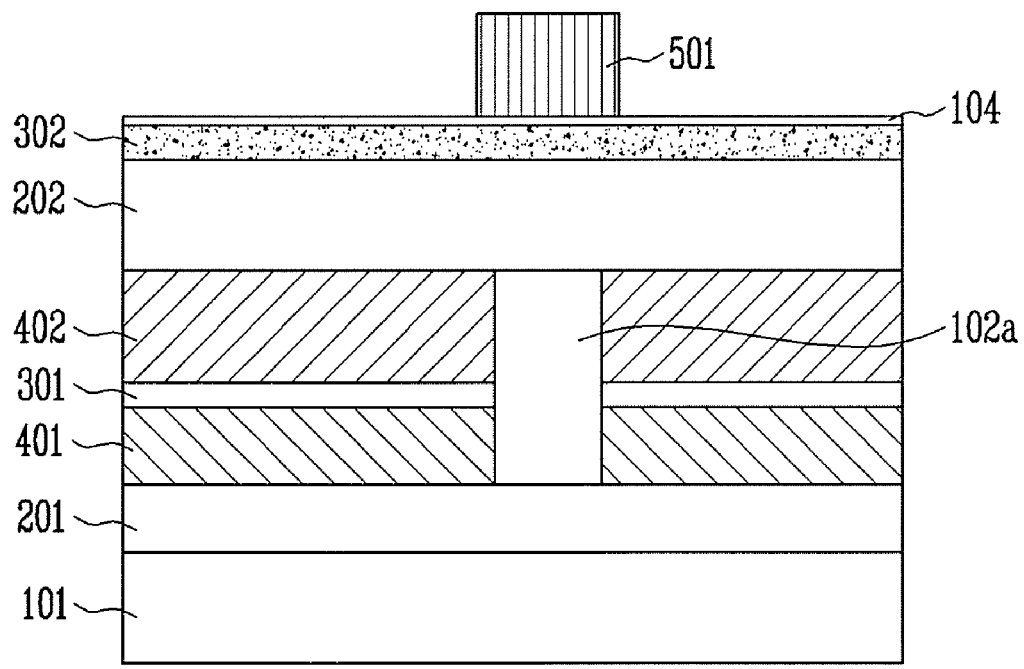
FIGS. 9A and 9B are views of a dual structure FinFET according to a second embodiment of the present invention.
Figure 9B:
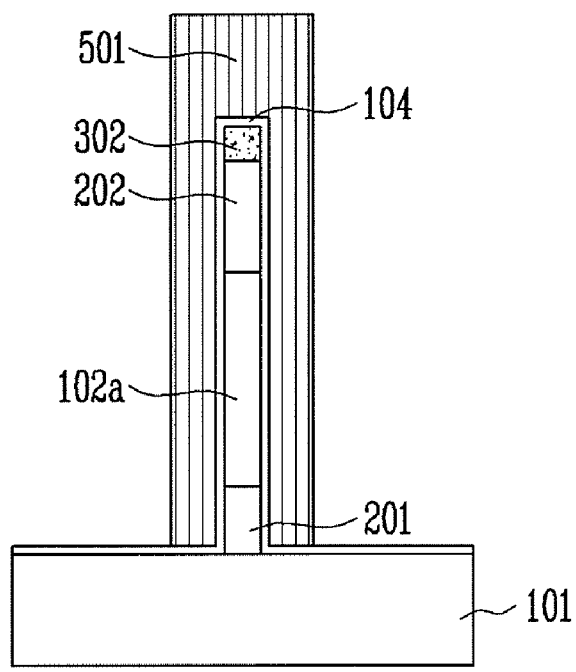

FIGS. 9A and 9B are views of a dual structure FinFET according to another embodiment of the present invention.

In the present embodiment, the upper device may be formed by depositing and crystallizing amorphous silicon or polycrystalline silicon instead of using the epitaxial layer for the upper device. That is, the first solid source material layer 401, the solid source material interlayer insulating layer 301, and the second solid source material layer 402 are deposited, and then trench etching is performed on the location where the buried oxide layer 102a is to be formed. The buried oxide layer 102a may be then formed and planarized by a CMP process, and amorphous or polycrystalline silicon may be deposited and crystallized by laser annealing or the like to form the upper device. According to the above-described method, the upper and lower devices can be formed without being subjected to epitaxial growth and oxygen implantation processes. The other configurations and manufacturing processes will be referred to the description of FIGS. 3 to 8.

Figure 10A:
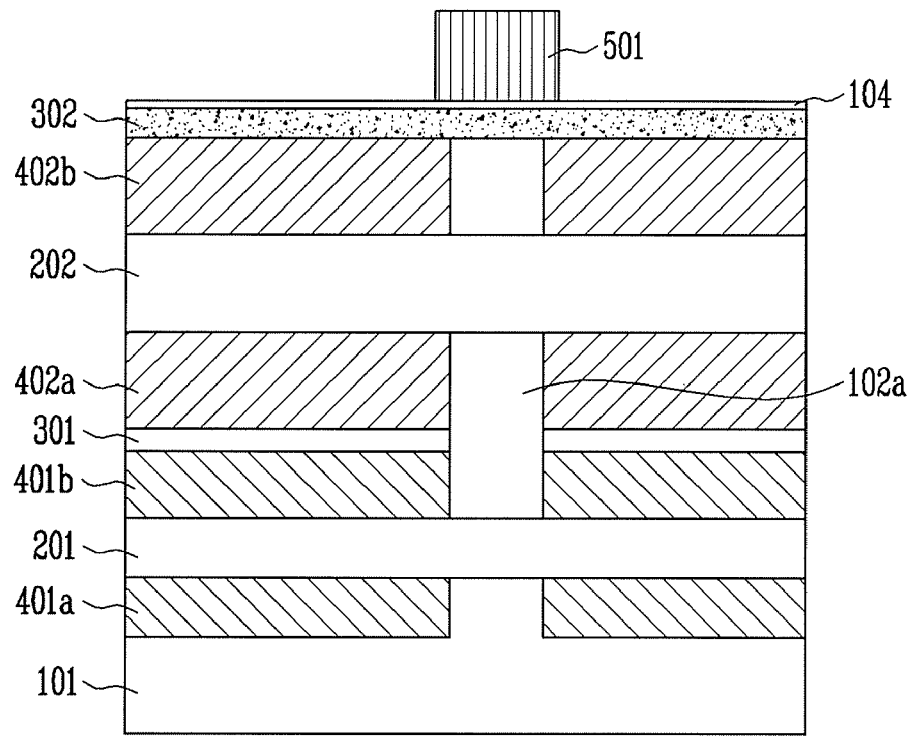
FIGS. 10A and 10B are views of a dual structure FinFET according to a third embodiment of the present invention.
Figure 10B:
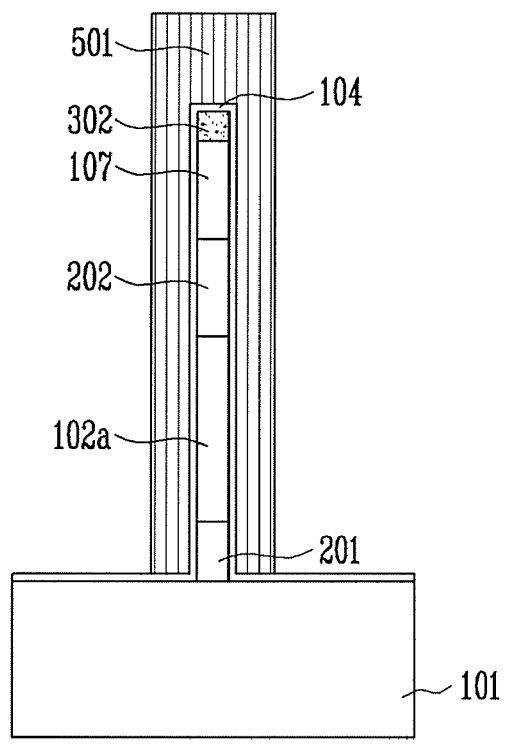

FIGS. 10A and 10B are views of a dual structure FinFET according to still another embodiment of the present invention.

Referring to FIGS. 10A and 10B, the first solid source material layers 401a and 401b may be positioned above and below the lower silicon layer 201 to increase doping of the source and drain, and the second solid source material layers 402a and 402b may be positioned above and below the upper silicon layer 202 to strength the solid source doping, respectively. The other configurations and manufacturing processes will be referred to the description of FIGS. 3 to 8.

According to a dual structure FinFET of the present invention as described above, existing plane type FinFETs can be stacked to reduce a layout area by two to five times the layout area of a conventional P-type device, so that the density of integration of a circuit can be increased. That is, current drivability of the P-type device can be adjusted in the same area, and separation of the N-type device and the P-type device can be implemented by forming a buried oxide layer without etching a trench or forming a field oxide layer.

Also, when an inverter circuit is formed, a FinFET is used instead of a conventional MOSFET, so that a short channel effect severely affecting a nano-level circuit can be overcome.

Further, an upper device is formed by an epitaxial growth method so that not only current drivability of the upper device can be exactly controlled but also carrier mobility can be increased using different kinds of materials such as silicon germanium or the like, and source and drain are formed while a buried oxide layer is formed, so that an additional high temperature process is not required, which is advantageous for forming a high-k gate insulating layer or a metal gate.

At the time of forming a buried oxide layer, since some portions of upper and lower silicon layers are transformed to oxide layers to form a raised source and drain, series parasitic resistances of the source and drain of the upper and lower devices can be decreased to enhance drivability.

When solid source material layers are used, damages of a thin film due to implantation of inactivation ions can be suppressed, and a stacked inverter having a stabilized electrical property can be manufactured by a simpler and lower-cost process.

Although exemplary embodiments of the present invention have been described with reference to the attached drawings, the present invention is not limited to these embodiments, and it should be appreciated to those skilled in the art that a variety of modifications and changes can be made without departing from the spirit and scope of the present invention.

What is claimed is:

1. A Fin Field Effect Transistor (FinFET), comprising:
   a lower device including a lower silicon layer formed on a substrate and a gate electrode vertically formed on the substrate;
   an upper device including an upper silicon layer formed on the lower device and the vertically formed gate electrode; and
   a first solid source material layer, a solid source material interlayer insulating layer, and a second solid source material layer sequentially formed between the lower silicon layer and the upper silicon layer.

2. The FinFET according to claim 1, wherein the first solid source material layer and the second solid source material layer are made of boronsilicate glass (BSG), phosphosilicate (PSG), p-doped tetraethylene-ortho-silicate (B-TEOS), or n-doped tetraethylene-ortho-silicate (P-TEOS).

3. The FinFET according to claim 2, wherein the first solid source material layer and the second solid source material layer are made of impurities of different types from each other.

4. The FinFET according to claim 1, wherein the solid source material interlayer insulating layer is made of at least one layer of a nitride layer and an oxide layer.

5. The FinFET according to claim 1, wherein the upper silicon layer is made of an epitaxially grown epitaxial layer, an amorphous silicon layer, or a polycrystalline silicon layer.

6. The FinFET according to claim 1, further comprising:
   a buried oxide layer formed in central regions of the first solid source material layer, the solid source material interlayer insulating layer and the second solid source material layer;
   a gate insulating layer surrounding the gate electrode;
   a common drain contact electrically connected to the lower silicon layer and the upper silicon layer;
   a lower source contact electrically insulated from the upper silicon layer and electrically connected to the lower silicon layer; and
   an upper source contact electrically connected to the upper silicon layer.

7. The FinFET according to claim 6, wherein the buried oxide layer is formed from the first solid source material layer to the second solid source material layer.

8. The FinFET according to claim 7, wherein the buried oxide layer comprises a first extension extending into the lower silicon layer and a second extension extending into the upper silicon layer.

9. The FinFET according to claim 8, wherein the first and second extensions are formed by diffusing oxygen ions into the upper and lower silicon layers by annealing performed after the oxygen ions are implanted.

10. The FinFET according to claim 9, wherein each of the first and second extensions has a thickness of 10 nm to 100 nm.

11. The FinFET according to claim 1, further comprising:
    a lower solid source material layer formed below the lower silicon layer; and
    an upper solid source material layer formed above the upper silicon layer.

12. The FinFET according to claim 1, wherein the substrate is one of a silicon on insulator (SOI) substrate, a silicon substrate, a silicon germanium insulator (SGOI) substrate and a silicon germanium (SiGe) substrate.

13. A method of manufacturing a Fin Field Effect Transistor (FinFET), comprising:
    preparing a substrate where a lower silicon layer is formed;
    sequentially forming a first solid source material layer, a solid source material interlayer insulating layer, and a second solid source material layer, on the lower silicon layer;
    etching the first solid source material layer, the solid source material interlayer insulating layer and the second solid source material layer, and forming an upper silicon layer on an etched region and the second solid source material layer;
    forming an buried oxide layer by annealing after the upper silicon layer is formed;
    blanket plasma-etching the upper silicon layer, the second solid source material layer, the solid source material interlayer insulating layer, and the first solid source material layer to form an active region of a Fin structure channel;
    depositing and etching a gate material on the substrate to form a gate electrode; and
    forming a gate insulating layer above the gate electrode, forming a drain contact and a first source contact to be electrically connected to the lower silicon layer on the gate insulating layer, and forming a second source contact to be electrically connected to the upper silicon layer on the gate insulating layer.

14. The method according to claim 13, wherein the upper silicon layer is formed of one of an epitaxially grown epitaxial layer, an amorphous silicon layer and a polycrystalline silicon layer.

15. The method according to claim 14, further comprising:
    forming a chemical mechanical polishing stopper for controlling the growth height of the epitaxial layer when the upper silicon layer is the epitaxial layer.

16. The method according to claim 13, further comprising:
    forming a lower solid source material layer below the lower silicon layer; and
    forming an upper solid source material layer on the upper silicon layer.

17. The method according to claim 13, wherein the first and second solid source material layers, and the lower and upper solid source material layers are formed of one of doped boronsilicate glass (BSG), doped phosphosilicate (PSG), p-doped tetraethylene-ortho-silicate (B-TEOS) and n-doped tetraethylene-ortho-silicate (P-TEOS).

18. The method according to claim 13, wherein the first solid source material layer and the second solid source material layer are made of impurities of different types from each other.

19. The method according to claim 13, further comprising:
    forming an oxide layer in the first source contact in contact with the upper silicon layer to electrically insulate the upper silicon layer from the first source contact at the time of forming the first source contact.

* * * * *